US007701247B1

(12) United States Patent
Nelson

(10) Patent No.: US 7,701,247 B1
(45) Date of Patent: Apr. 20, 2010

(54) DATA BUFFERING WITH READOUT LATENCY FOR SINGLE-EVENT UPSET TOLERANT OPERATION

(75) Inventor: Michael D. Nelson, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 1209 days.

(21) Appl. No.: 11/261,685

(22) Filed: Oct. 28, 2005

(51) Int. Cl.
*H03K 19/173* (2006.01)
(52) U.S. Cl. ....................................................... 326/38
(58) Field of Classification Search ............. 326/37–41, 326/47, 101
See application file for complete search history.

(56) References Cited

U.S. PATENT DOCUMENTS

2002/0167337 A1* 11/2002 Chelcea et al. .............. 326/100
2003/0218925 A1* 11/2003 Torjussen et al. ........... 365/200

* cited by examiner

*Primary Examiner*—Rexford N Barnie
*Assistant Examiner*—Thienvu V Tran
(74) *Attorney, Agent, or Firm*—W. Eric Webostad

(57) ABSTRACT

Apparatus and method for outputting data from an integrated circuit having programmable logic for Single-Event Upset tolerant operation is described. Configuration memory associated with the programmable logic is read. Bits of the configuration memory read are error checked. Buffers are cycled to select one to load and another one to unload responsive to completion of each error checking cycle of the bits. For a cycle of the error checking, a first data portion is loaded into one buffer of the buffers for the cycle, it is verified whether the bits are valid for the cycle, and a second data portion is unloaded from another buffer of the buffers responsive to the bits being valid for the cycle.

11 Claims, 6 Drawing Sheets

DATA BUFFERING WITH READOUT LATENCY FOR SINGLE-EVENT UPSET TOLERANT OPERATION

FIELD OF THE INVENTION

One or more aspects of the invention relate generally to integrated circuits and, more particularly, to data buffering with readout latency for single-event upset ("SEU") tolerant operation.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation. One such FPGA is the Xilinx Virtex™ FPGA available from Xilinx, Inc., 2100 Logic Drive, San Jose, Calif. 95124.

Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, a design instantiated in programmable logic of an FPGA ("FPGA fabric") was generally limited to more SEU-tolerant applications. In less tolerant applications, FPGA fabric was conventionally not implemented owing to a potential for outputting corrupted data due to an SEU causing a configuration memory cell bit to change state ("flip"). Even though SEU-hardened configuration memory cells may be used, such SEU-hardened configuration memory cells may still be susceptible to an SEU. Accordingly, a more thorough solution to preventing the output of corrupted data due to an SEU would be desirable and useful.

SUMMARY OF THE INVENTION

One or more aspects of the invention generally relate to integrated circuits and, more particularly, to data buffering with readout latency for single-event upset ("SEU") tolerant operation.

An aspect of the invention is an integrated circuit having programmable logic. Datapath logic is coupled to the programmable logic to receive data for output, the programmable logic including configuration memory. Readback/error-checking circuitry is configured to read back the configuration memory and to error check the configuration memory to determine status of the configuration memory responsive to readback/error-checking cycles. The datapath logic is coupled to the readback/error-checking circuitry to receive the status of the configuration memory responsive to the readback/error-checking cycles. The datapath logic is configured to alternate between at least a first buffer and a second buffer responsive to the status for separating the data into a first data portion for the first buffer and a second data portion for the second buffer. Data egress logic is coupled to the first buffer and the second buffer. The data egress logic is configured to alternate at least between the first buffer and the second buffer responsive to the status for outputting the first data portion and the second data portion to provide the data for output from the integrated circuit. The first data portion and the second data portion are each respectively stored in the first buffer and the second buffer for at least one cycle of the readback/error-checking cycles. The data egress logic is configured to halt output of the data from the integrated circuit responsive to the status of a readback/error-checking cycle indicating a configuration memory error condition.

Another aspect of the invention is a method for outputting data from an integrated circuit having programmable logic. Configuration memory associated with the programmable logic is repeatedly read. Configuration bits of the configuration memory read are repeatedly error checked. Buffers are repeatedly cycled to select one to load and another one to unload responsive to completion of each error checking cycle of the configuration bits. For a cycle of the error checking, a first data portion is loaded into one buffer of the buffers for the cycle, it is verified whether the configuration bits are valid for the cycle, and a second data portion is unloaded from another buffer of the buffers responsive to the configuration bits being valid for the cycle.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
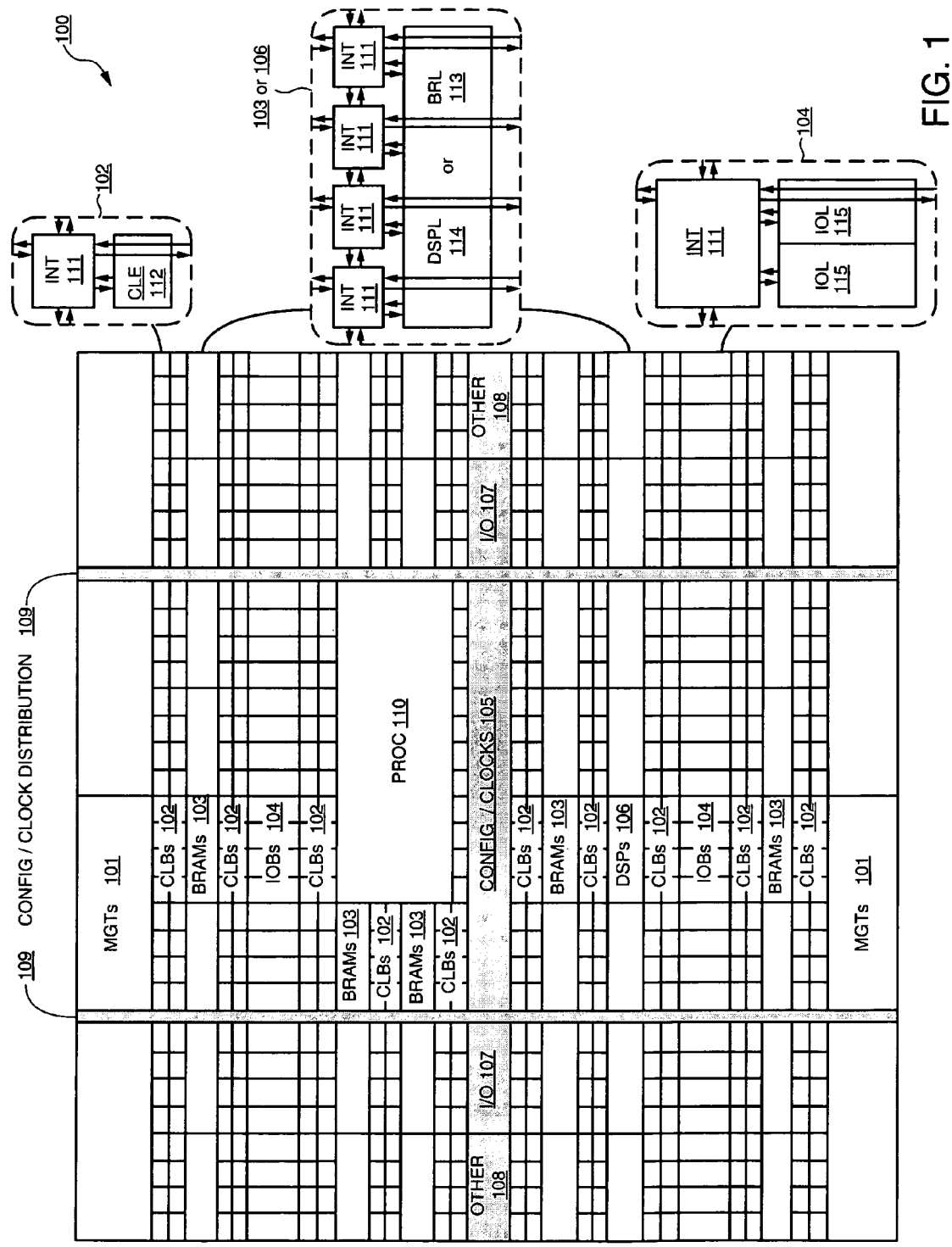
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include one or more dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx, Inc. of San Jose, Calif.

Figure 2A:
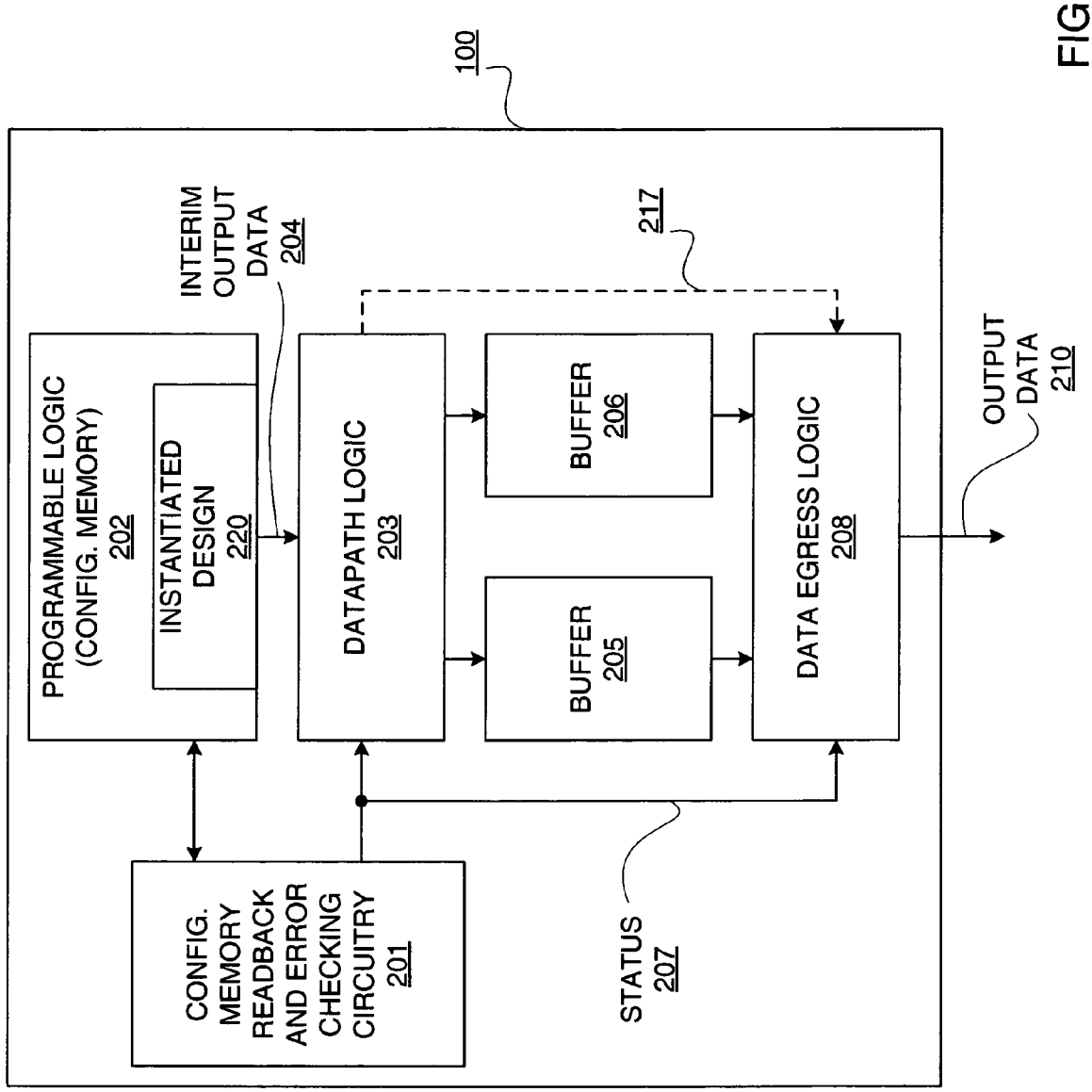
FIG. 2A is a high-level block diagram of an FPGA configured for data buffering with readout latency for single-event upset ("SEU") tolerant operation.

FIG. 2A is a high-level block diagram of an FPGA 100 configured for data buffering with readout latency for single-event upset ("SEU") tolerant operation. FPGA 100 includes programmable logic 202. As is known, programmable logic 202 includes configuration memory (hereinafter, configuration memory 202). Thus, a design instantiated in programmable logic, such as instantiated design 220, means that configuration bits have been written to configuration memory 202. As is known, a configuration memory error condition may occur, such as when an SEU causes a configuration bit to flip inadvertently. As is known, a single-event upset may be caused by cosmic radiation, or high energy particles from radioactive decay, A bit flip, or a soft error, may also be caused by other forms of interference, such as electromagnetic noise from other components, or sources of energy. As used herein, an SEU may encompass any soft error resulting in a bit flip. A bit flipping from a logic 0 to a logic 1 or a logic 1 to a logic 0 can have negative consequences with respect to providing interim output data 204. In other words, an SEU may mean that interim output data 204 is corrupted or otherwise unreliable. Accordingly, for deployment of FPGA 100 in systems where corruption of interim output data 204 may not be tolerated, such interim data 204 is prevented from being output from FPGA 100. In other words, if interim output data 204 is corrupted, then such corrupted data may be prevented from being output.

Configuration memory readback and error checking circuitry 201 is coupled to configuration memory 202 and datapath logic 203. As is known, configuration memory readback and error checking circuitry 201 may be used for reading back bits of configuration memory 202 and error checking such read back memory bits to determine whether or not an SEU has inadvertently caused one or more of such bits to flip. There are many known error checking technologies that may be used, including use of a code, a syndrome, or a parity check. For purposes of clarity by way of example and not limitation, it shall be assumed that error checking is done with parity. Notably, odd or even parity may be used. However, it should be appreciated that any form of deterministic monitoring of configuration memory 202 may be used to identify an SEU.

For each completed readback and error checking cycle, configuration memory readback and error checking circuitry 201 asserts a status signal 207 indicating whether or not an error was detected. Status signal 207 may be coupled to datapath logic 203 and data egress logic 208. Alternatively, status signal 207 may be provided to datapath logic 203, and datapath logic 203 may provide status signal 207 to data egress signal 208. In an alternative implementation as indicated by dashed line 217, datapath logic 203 and data egress logic 208 may be controlled in lock-step hierarchically responsive to status signal 207 and signal 217, respectively, where datapath logic 203 controls operation of data egress logic 208. However, for purposes of clarity by way of example and not limitation, it shall be assumed that status signal 207 is provided from configuration memory readback and error checking circuitry 201 to both datapath logic 203 and data egress logic 208 for error status synchronous operation responsive to status signal 207.

Interim output data 204 is controllably provided to buffers 205 and 206. Buffers 205 and 206 are coupled to receive interim output data 204 via datapath logic 203. In other words, datapath logic 203 controls whether interim output data 204 is stored in buffer 205 or whether interim output data 204 is stored in buffer 206. For purposes of clarity by way of example, only two buffers, namely buffers 205 and 206, are used for this example. However, it should be appreciated from the description that follows that fewer than two or more than two buffers may be used. It should also be noted that the buffers may actually be implemented as a single buffer or memory that is organized as two or more buffers.

Responsive to assertion of status signal 207, datapath logic 203 toggles interim output data 204 to be provided to either buffer 205 or buffer 206. Thus, for a first readback/error checking cycle, interim output data 204 may be streamed to buffer 205. On a second or subsequent readback/error checking cycle, datapath logic 203 may direct interim output data 204 to buffer 206. Thus, interim output data 204 is separated into respective portions responsive to alternating readback/error checking cycles, as indicated by assertion of status signal 207 indicating a completed readback/error checking cycle. Thus, for example, it should be appreciated that instantiated design 220, having produced interim output data 204, may have half of such interim output data 204 stored in buffer 205 and another half of such interim output data 204 stored in buffer 206 over two readback/error checking cycles.

Data egress logic 208 is coupled to the output of buffers 205 and 206. Data egress logic 208 is configured to select output from either buffer 205 or buffer 206 to provide output data 210 responsive to assertion of status signal 207. Thus, for example, on a readback/error checking cycle, data egress logic 208 may allow buffer 205 to output data for providing output data 210, and on a subsequent readback/error checking cycle, data egress logic 208 may toggle to allow buffer 206 to provide output data 210 responsive to status signal 207. Notably, only one buffer at a time, namely either buffer 205 or buffer 206 in this example, is allowed to provide output as part of output data 210. It should also be noted that part or all of each of readback and error checking circuitry 201, datapath logic 203, buffers 205 and 206, and data egress logic 208 may be implemented in programmable logic. That is, each of those blocks may be implemented in dedicated circuits, programmable logic or fabric, or a combination thereof.

By storing data for output in a buffer and waiting for a readback/error checking cycle to complete, it should be appreciated that a degree of SEU tolerance may be had. For example, if status signal 207 indicates that an SEU has been detected on a current readback/error checking cycle, any buffered data for output data 210 may be prevented from being output by data egress logic 208 responsive to status signal 207. Additionally, datapath logic 203 may be configured to stop operation of data flow from instantiated design 220 into buffers 205 and 206 responsive to status signal 207.

However, it should be appreciated that once a readback/error checking cycle is initiated, it may take some time to complete. During this time window, an SEU may take place in previously read configuration memory. Accordingly, as such configuration memory had already been read during such a readback/error checking cycle, the SEU would not be detected during that cycle, but would be detected on a subsequent cycle. Thus, to provide more SEU tolerance, data may be stored in buffers 205 and 206 for at least two readback/error checking cycles of configuration memory readback and error checking circuitry 201. Thus, as configuration memory readback and error checking circuitry 201 repeatedly reads and error checks configuration memory, an SEU, if any transpires, may be detected within two of such readback/error checking cycles.

Figure 2B:
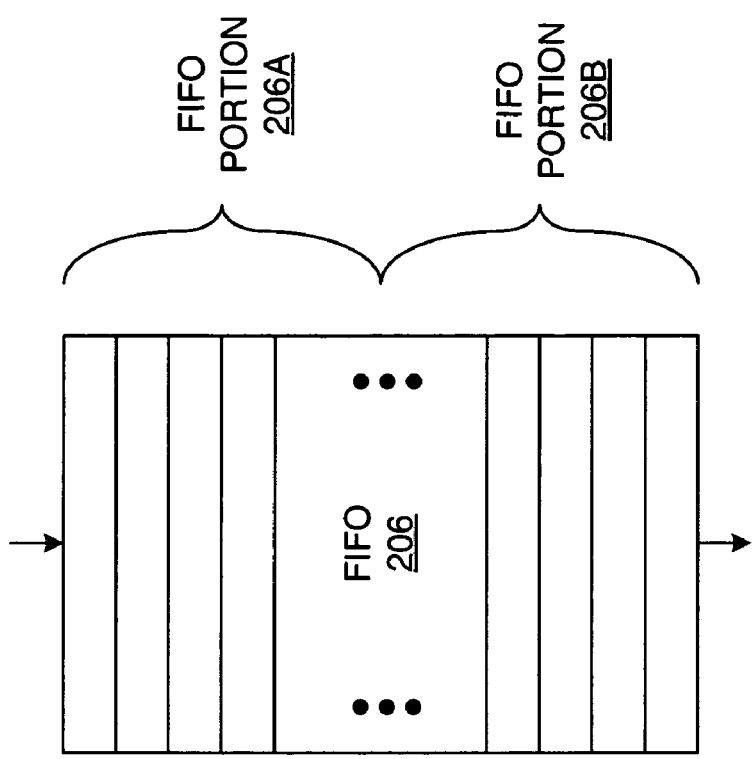
FIG. 2B is a high-level block diagram depicting an exemplary embodiment of buffers of FIG. 2A as being first-in, first-out buffers ("FIFOs").
Figure 2B:
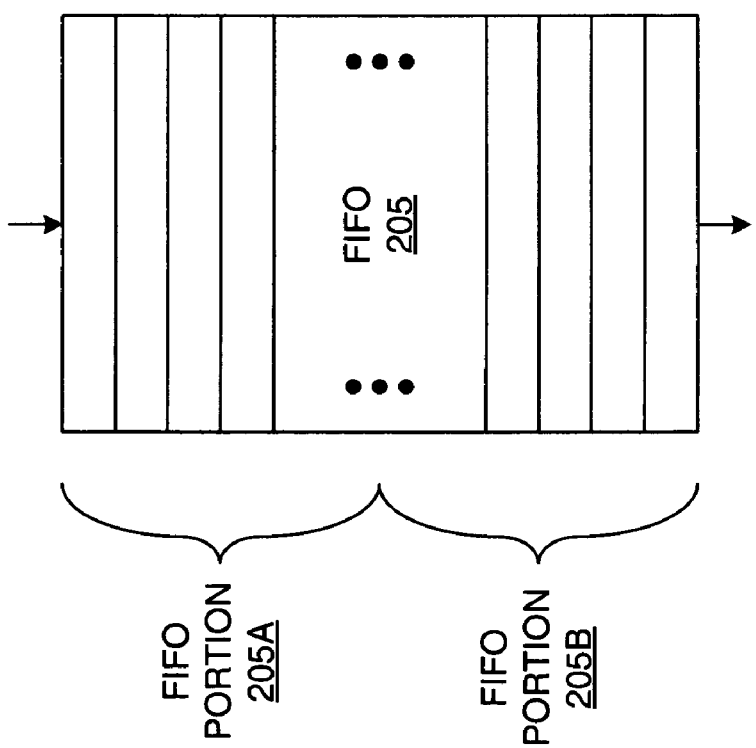

FIG. 2B is a high-level block diagram depicting an exemplary embodiment of buffers 205 and 206 of FIG. 2A as being first-in, first-out buffers ("FIFOs") 205 and 206. FIFO 205 includes an upper FIFO portion 205A and a lower FIFO portion 205B. FIFO 206 includes an upper FIFO portion 206A and a lower FIFO portion 206B. Each FIFO portion 205A, 205B, 206A, and 206B is sufficiently large to hold a portion of interim output data 204 provided to either FIFO 205 or FIFO 206 during a readback/error checking cycle. Thus, for example, FIFO portion 205B may have data output therefrom while FIFO portion 206A is having data input therein, and FIFO portions 206B and 205A have previously been loaded with data. Continuing this example, on a subsequent readback/error checking cycle, the data in FIFO portion 205A is shifted down to FIFO portion 205B and incoming data is read into FIFO portion 205A. During such subsequent readback/error checking cycle, data is output from FIFO portion 206B. In this manner, there is a two readback/error checking cycle latency for readout of data from either of FIFOs 205 or 206. That is, data portions are stored in FIFOs 205 and 206 in first and second alternating cycles, respectively, where the first alternating cycles and the second alternating cycles may be approximately 180 degrees out of phase with and interspersed with one another. Thus, any SEU may be detected prior to any output of buffered data for data 210 as controlled by data egress logic 208. Accordingly, in the event that status signal 207 indicates that an SEU has been detected, outputting of output data 210 may be prevented prior to any corrupted data being output from FPGA 100. Notably, responsive to detection of an SEU, FPGA 100 may be rebooted, or depending on the error, as well as possibly the type of error-checking implemented, the error may be corrected by resetting the configuration memory bit or bits inadvertently flipped.

Figure 3A:
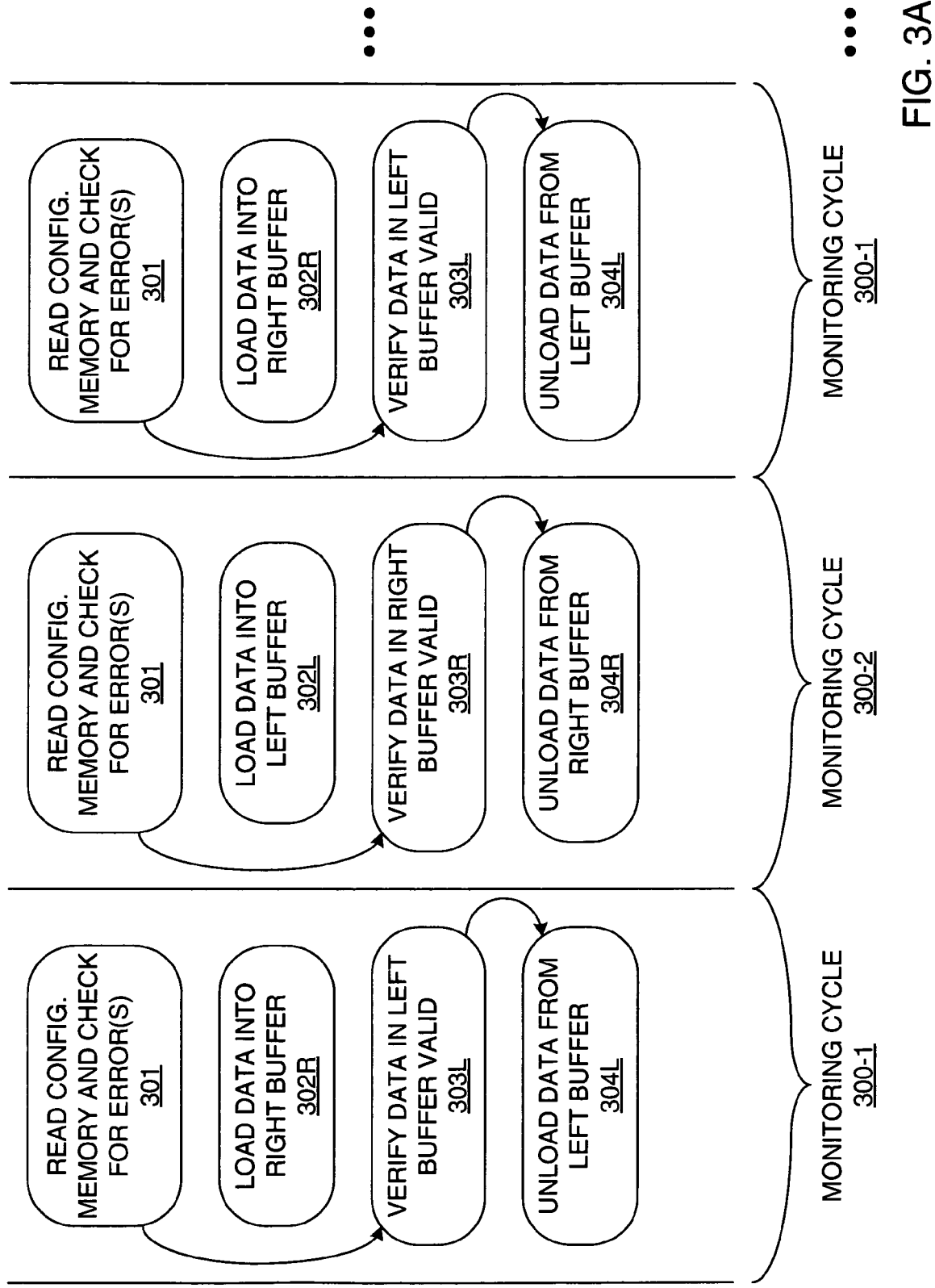
FIG. 3A is a high-level data flow diagram for respective monitoring cycles.

FIG. 3A is a high-level data flow diagram for respective monitoring cycles, which monitoring cycles are described with renewed reference to FIGS. 2A and 2B. For a first monitoring cycle 300-1, configuration memory is read and checked for errors at 301. During reading configuration memory and checking for errors at 301, data may be loaded into FIFO 205 at 302R. Data in FIFO portion 206B may be determined to be valid if no error is detected as indicated by a status signal 207. Accordingly, at 303L, such status signal 207 may be used to verify data in FIFO 206 is valid with respect to FIFO portion 206B. Accordingly data egress logic 208 may be instructed to unload data from FIFO portion 206B at 304L. This would complete a monitoring cycle, namely a monitoring cycle 300-1. For a subsequent monitoring cycle, such as monitoring cycle 300-2, configuration memory is again read and checked for errors at 301, and meanwhile data is loaded into FIFO 206 at 302L. Responsive to status signal 207 indicating that no SEU was detected, data in FIFO portion 205B of FIFO 205 may be determined as being valid at 303R. Accordingly, data egress logic 208 may be instructed responsive to status signal 207 to unload data from FIFO portion 205B from FIFO 205 at 304R. After monitoring cycle 300-2, monitoring cycle 300-1 may be repeated, as data in FIFOs will sequentially drop down and may sequentially be cycled out.

Figure 3B:
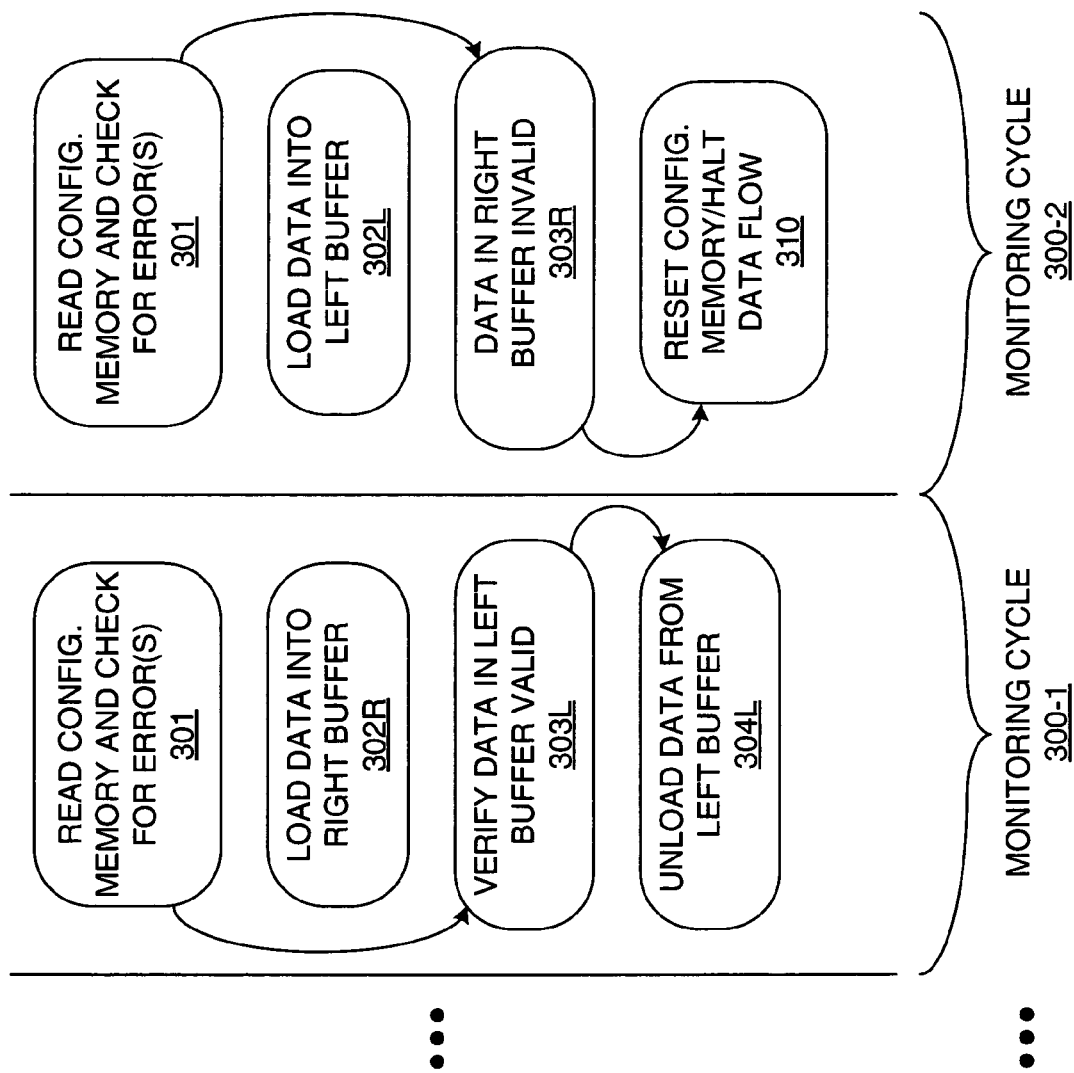
FIG. 3B is a high-level flow diagram depicting an extension of the exemplary embodiment of FIG. 3A in the event that an SEU is detected.

FIG. 3B is a high-level flow diagram depicting an extension of the exemplary embodiment of FIG. 3A in the event that an SEU is detected. Proceeding from a monitoring cycle 300-1, a subsequent monitoring cycle 300-2 may read configuration memory and check for errors at 301. Meanwhile, data is loaded into FIFO portion 206A of FIFO 206 at 302L. However, responsive to detection of an SEU, it is determined at 303R that the data in FIFO portion 205B of FIFO 205 is corrupted or is at least potentially corrupted. Accordingly, at 310, FPGA 100 may be instructed to reset configuration memory and prevent data output from FPGA 100. This halting of data output takes place prior to outputting any data of FIFO portion 205B for this example. Thus, the possibility of data corrupted from an SEU being output from FPGA 100 is avoided.

Figure 4:
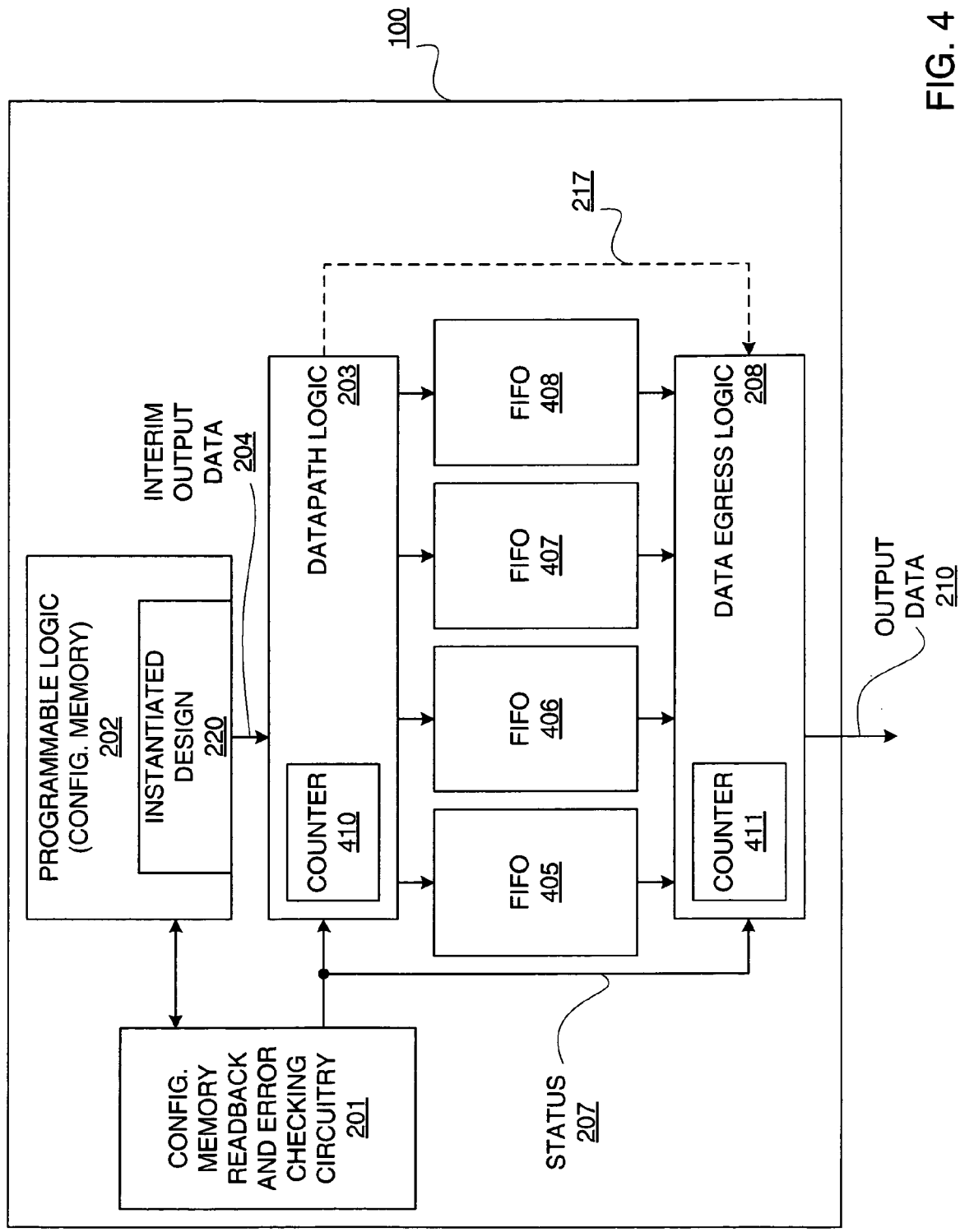
FIG. 4 is a high-level block diagram depicting an exemplary alternative embodiment of an FPGA configured for data buffering with readout latency for SEU tolerant operation.

FIG. 4 is a high-level block diagram depicting an exemplary alternative embodiment of an FPGA 100 configured for data buffering with readout latency for SEU tolerant operation. FPGA 100 of FIG. 4 is similar to FPGA 100 of FIGS. 2A and 2B, except rather than having two FIFOs which are two readback/error checking cycles deep with respect to storing interim output data 204, in the example embodiment of FIG. 4, four FIFOs, namely FIFOs 405 through 408, are coupled between datapath logic 203 and data egress logic 208. Furthermore, datapath logic 203 and data egress logic 208 of FIG. 4 are different from that of FIG. 2A in that a counter has been added to each of them. Counter 410 of datapath logic 203 and counter 411 of data egress logic 208 are coupled to receive status signal 207 to count each completed readback/error checking cycle. Thus, by synchronizing and phase-offsetting counters 410 and 411 to increment responsive to status signal 207, each increment may be used to select which FIFO is to have data loaded into it and which FIFO is to have data unloaded from it, assuming no SEU is detected. In the event that an SEU is detected, as previously described, output data 210 is halted prior to providing any potentially SEU-corrupted data.

Thus, FIFOs 405 through 408 may only be sufficiently deep to store at least one readback/error checking cycle's worth of interim output data 204. In this example, if FIFO 405 is being loaded with data from datapath logic 203, then data in FIFO 407, which is approximately two readback/error checking cycles older than the data being loaded into FIFO 405, may be output under control of data egress logic 208 to provide output data 210. On a subsequent iteration of a readback/error checking cycle, FIFO 406 may be loaded with data from datapath logic 203 and FIFO 408 may be unloaded to provide output data 210 under control of data egress logic 208. Thus, counters 410 and 411 may be set to be 180 degrees out of phase with respect to one another, namely, two counts off with respect to one another in the sequence of readback/error checking cycles.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. For example, data output 210 may be encoded for error checking and correction, as needed, by a receiver. Claim(s) listing steps do not imply any order of the steps. Trademarks are the property of their respective owners.

What is claimed is:

1. A method for outputting data from an integrated circuit having programmable resources, comprising:

repeatedly reading configuration memory associated with the programmable resources;

repeatedly error checking configuration bits of the configuration memory read;

repeatedly cycling buffers to select one to load and another one to unload responsive to completion of each error checking cycle of the configuration bits; and for a first cycle of the error checking,
loading a first data portion into a first buffer of the buffers for the first cycle;
verifying whether the configuration bits are valid for the first cycle;
unloading a second data portion from a second buffer of the buffers responsive to the configuration bits being valid for the first cycle; and
preventing the outputting of the second data portion from the second buffer of the buffers responsive to one or more of the configuration bits being invalid for the first cycle.

2. The method according to claim 1, further comprising:
for a second cycle of the error checking,
loading a third data portion into the second buffer of the buffers;
verifying whether the configuration bits are valid for the second cycle; and
unloading a fourth data portion from the first buffer of the buffers responsive to the configuration bits being valid for the second cycle.

3. The method according to claim 2, wherein the fourth data portion is unloaded from the first buffer after being buffered therein for at least two error checking cycles.

4. The method according to claim 3, wherein the at least two error checking cycles include the first cycle and the second cycle.

5. The method according to claim 4, wherein the integrated circuit is a programmable logic device.

6. The method according to claim 5, further comprising:
instantiating a design in the programmable resources; and
obtaining data from the instantiated design for loading into the buffers in portions.

7. The method according to claim 6, further comprising outputting the data from the programmable logic device from the buffers in the portions.

8. The method according to claim 1, wherein the buffers are first-in, first-out buffers.

9. The method according to claim 8, wherein each of the buffers is capable of buffering data for at least the first cycle of the error checking, and wherein the buffers comprise at least four buffers.

10. The method according to claim 8, wherein the buffers are coupled between datapath logic and data egress logic, the datapath logic and the data egress logic each configured to control data flow responsive to cyclic operation of the error checking.

11. The method according to claim 10, wherein each of the buffers is capable of buffering data for at least the first cycle of the error checking, and wherein the integrated circuit is a programmable logic device.

* * * * *